United States Patent
Eckl et al.

(10) Patent No.: US 6,894,573 B2
(45) Date of Patent: May 17, 2005

(54) TUNABLE NEGATIVE RESISTANCE DEVICE

(75) Inventors: Wolfgang Franz Eckl, Spardorf (DE);
Georg Fischer, Nuremberg (DE);
Gerhard Kaminski, Fuerth (DE)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 10/601,797

(22) Filed: Jun. 23, 2003

(65) Prior Publication Data

US 2004/0012451 A1 Jan. 22, 2004

(30) Foreign Application Priority Data

Jul. 16, 2002 (EP) ............................................. 02254999

(51) Int. Cl.$^7$ ................................................ H03B 5/12
(52) U.S. Cl. .................................. 331/117 R; 331/167
(58) Field of Search ........................... 331/117 R, 167, 331/36 C; 333/197, 205; 334/14, 18

(56) References Cited

U.S. PATENT DOCUMENTS

| | | | |
|---|---|---|---|
| 4,667,168 A * | 5/1987 | Shiomi et al. ............... 331/1 R |
| 5,880,921 A | 3/1999 | Tham et al. ................. 361/233 |
| 5,959,516 A | 9/1999 | Chang et al. ................. 334/14 |
| 6,232,847 B1 | 5/2001 | Marcy, 5th et al. ......... 331/167 |
| 6,310,419 B1 | 10/2001 | Wood .......................... 310/306 |
| 6,621,364 B2 * | 9/2003 | Grewing et al. ........ 331/177 V |
| 2001/0050597 A1 * | 12/2001 | Chigira et al. .......... 331/108 D |

FOREIGN PATENT DOCUMENTS

DE         100 53 216 A1    5/2002    ............ H03B/5/02

* cited by examiner

Primary Examiner—Robert Pascal
Assistant Examiner—Joseph Chang
(74) Attorney, Agent, or Firm—Martin I. Finston

(57) ABSTRACT

The invention proposes a device for providing tunable high-frequency and/or radio-frequency comprising within one IC-package at least four signal paths providing at least two input and at least two output ports (rf-port1, rf-port2, rf-prot3, rf-port4) at least one active component (T) and at least one variable passive component ($C_1$, $C_2$) connected at least with an input port of the active component (T), and at least one control path for controllable tuning the at least one variable passive component ($C_1$, $C_2$).

9 Claims, 1 Drawing Sheet

TUNABLE NEGATIVE RESISTANCE DEVICE

CROSS REFERENCE TO RELATED APPLICATION

This application claims priority of European Application No. 02254999.2 filed on Jul. 16, 2002.

TECHNICAL FIELD

The present invention relates to a device for providing tunable high-frequency and/or radio-frequency.

BACKGROUND OF THE INVENTION

With regard to mobile communication systems, such as based on a GSM (Global System for Mobile communications), UMTS (Universal Mobile Telecommunication Systems), WCDMA (Wideband Code Division Multiple Access) and/or CDMA 2000 standard there is a permanently increasing need to design re-configurable multiband and/or multistandard mobile communication systems. This for example, is based on the fact, that on the one hand side more and more frequency bands are opened up and being licensed for mobile communication and on the other hand side, several standards are provided in parallel, between which the customers and/or the network operator would like to select.

However, until today, for every new frequency band an individual radio has to be designed that forces a complex infrastructure and terminal vendor to a great variety of products, in particular in terms of base stations and/or user terminals, such as handsets adapted to be used within these communication systems.

As a consequence, there is a need both for new receiving and/or transmitting architectures in particular for ensuring re-configurability in terms of frequency band and system standards and for improved flexible circuits in particular for optimization, tuning and/or matching purposes.

Moreover, even with regard to other high frequency receiving/transmitting-systems for data transmission there is an increased need for receiver and/or transmitter chains, which provide flexibility in use by re-configurability and by tuning and/or matching functionality for optimization.

Based on the above needs, in particular with regard to upcoming multiband and/or multistandard systems, one of the major task is to tune the respective incorporated voltage controlled oscillators (VCO) within the desired frequency band and to match those VCO's to the resonance circuit (or tank-circuit) for optimization. Accordingly, even VCO's must be re-configurable and must have tuning and matching facilities for optimization.

The most common solution to implement VCO's for several frequency bands is however to design a lot of separate VCO-circuits for every band and to switch them on and off via a supply or control voltage.

However, designing a lot of separate VCO-circuits for every band is a very expensive solution, since, for example, every VCO typically comprises a tank-circuit, a tuning device, such as a varactor which has to be added separately to the tank circuit for obtaining tuning functionality, and a negative impedance for tuning on the oscillation. Moreover, the respective design is very difficult due to the fact that a trade-off between some conflicting requirements has to be made. Such conflicting requirements may include the reduction of wideband phase noise, of low frequency phase noise near the carrier and/or of so called "popcorn-noise" or Flicker noise, the stabilization of the oscillation under all conditions, the provision of linearity of frequency versus the control voltage and the provision of a large tuning range.

Furthermore, for determining the negative resistance conventionally two additional fixed capacitors have to be arranged between the basis, emitter and ground of the incorporated transistor, thereby causing an increased design trade-off. As a consequence, enabling a good tuning range usually results in a poor noise performance, whereas a bad VCO tuning range may cause a good noise behavior.

SUMMARY OF THE INVENTION

An object of the invention is therefore to provide in particular with regard to the above discussed state of the art a new and improved approach for providing an increased reconfiguration flexibility and even a wide tuning and/or matching flexibility with regard to high frequency or radio frequency, in particular suitable for use within base stations and/or user terminals, such as handsets adapted to be used within the above mentioned communication systems, especially for an enhanced tuning of a VCO within desired frequency bands, by simultaneously reducing undesirable parasitic influences.

Advantageous embodiments or refinements are the subject matter of the respective dependent claims.

Accordingly, the invention proposes a device for providing tunable high-frequency and/or radio-frequency comprising within one IC-package at least four rf-signal paths providing at least two input and at least two output ports, at least one active component and at least one variable passive component connected at least with an input port of the active component, and at least one control path for controllable tuning the at least one variable passive component.

One of the main advantages achieved thereby is, that the inventive device is providing a complex re-configurable functionality implemented within one IC-package and hence, is able to cover a variety of tuning and matching tasks based on the tunable passive component. In addition, due to the integration of these components into one IC-package the dimensions are extremely small with regard to high frequencies to be tuned and/or matched and hence high frequency signal based parasitic effects caused by large transmission lines are significantly reduced.

Furthermore, there is only a very low amount of board space necessary to cover a variety of tuning and matching tasks. Moreover, based on the specific adaptation functionality, each of the port can be used in general as input and output port, respectively, and hence the flexibility of providing a plurality of different signal path circuits is enhanced.

Moreover, even with regard to multiband and/or multistandard purposes the invention provides a cost saving and board space saving solution, since the implementation of several individual devices is avoided.

Additionally, by the incorporation of the inventive tuning device into an rf-system, sensitive rf-parameters may easily be tuned for optimization purposes, instead of individually designing and optimizing a plurality of matching circuits. This enables, in particular with regard to the manufacture, a significant reduction of development costs and the possibility of compensating tolerances. Moreover, the redesign of critical circuits, for example due to a replacement of certain components usually resulting in time and cost consuming modifications of the circuitry layout, can often be avoided.

Advantageously at least two variable passive components, each of which is individually controllable by the at least one control path are provided to further enhance the tuning range.

According to advantageous embodiments, the active component is a transistor element, in particular based on silicon technology, especially on bipolar technology, or field effect technology, and/or the passive components are variable capacitors. Based thereon the ratio of both capacitances can be tuned for optimization and the total capacitance can be tuned to achieve a desired frequency variation. Thus, the inventive device is advantageously used as active part or negative resistance of a voltage controlled oscillator, which can be completed by adding the DC components and a tank circuit, an inductor or a resonance circuit.

In particular in this regard, the invention proposes to couple a resonance circuit to the at least one tunable passive component in parallel, wherein the resonance circuit may be realized by a LC-resonance circuit, a ceramic quarter wavelength resonator, a crystal SAW-device, a MEMS-based LC combination and/or a MEMS-based fixed or variable inductor.

In particular the small dimensions of the inventive device further enables the combination of a set of VCO's to a re-configurable VCO-bank without any PCB constraints.

Moreover, by advantageously isolating the at least one control path from the signal path a further enhanced performance is ensured, since the controlling or tuning voltages or currents of the capacitor(s) can not conflict with the DC voltages of the transistor.

By using variable components respectively comprising an actuator for driving a movable or variable element of the tunable component to vary the effective area thereof, the control signal for controlling the components can be easily isolated from the high frequency signal path.

For the praxis, it is suggested, to provide a separate control path for each tunable component. In addition, the tuning paths for controlling the tunable devices are practically adapted to be controllable via an analogue voltage or via a digital to analogue converter.

According to a refinement, in particular for simplifying the integration within one IC-package it is proposed to fabricate the inventive device by using a so-called Micro-Electro-Mechanical-Systems (MEMS) technology.

By using such MEMS technology all internal parasitics are well defined and in comparison with the state of the art a production spread usually is avoided. The invention proposes further to produce tunable components as three-dimensional mechanical structures, in particular by employing a bulk micro machining and/or a surface micro machining technology.

Based thereon the tunable or variable capacitor, and even a possibly tunable inductor, incorporated within the inventive device is based on a ME MS-technique, i.e. on a MEMS-varactor or on a MEMS-variometer, advantageously with actuating mechanisms respectively comprising a mechanism based on an electrostatic, piezoelectric, thermal, magnetic or bi-metallic actuator functionality.

The tunable capacitors may be achieved by varying the effective area of the capacitor by changing the degree of engagement of fingers of comblike structures or by changing the distance between at least two plates. Thus, an achieved mechanical low pass characteristic of the tunable capacitors leads to a better noise performance and substantially no high frequency noise components or parts, such as caused by high value resistors, can modulate the inventive device and hence, according to the above advantageous application, the VCO. Additionally, due to the fact, that within MEMS-varactors no fluctuations and re-combinations of electron charges take place any popcorn-noise, sometimes called as shot-noise, is avoided.

Moreover, even such a MEMS-based device provides the possibility for an easy combination with further circuits, especially application specific circuits, based on Silicon, CMOS and/or BICMOS (Bipolar-CMOS) technology for example, especially allowing the integration of an active rf-signal circuit or even some control logic for an additional digital port.

As a consequence, by advantageously using the technique of Micro-Electro-Mechanical-Systems (MEMS) for the integration of tunable passive components, in particular varactors, and active components, in particular a transistor into one IC-package, a versatile electrical device for tuning a wide high-frequency range and even for matching purposes is provided, with the advantages of low noise of the tunable capacitors and of a very high isolation between the controlling paths and high-frequency paths. Hence, low tolerance components with well defined internal parasitics are achieved, wherein the complete inventive configuration can be utilized for covering reconfiguration, optimization or tuning purposes within a wide capacity and/or frequency range and hence can be used in several application areas.

Such application areas are especially the use within a communication system and/or network, in particular a mobile communication system and/or network based on a GSM, UMTS, WCDMA and/or CDMA 2000 standard, especially within an oscillator, in particular adapted for use within a receive and/or transmit radio unit of a mobile communication system, within a base station or within a user terminal in particular adapted for use within a mobile communication system. The invention proposes further an assembly adapted for enabling a plurality of tunable and/or re-configurable voltage controlled oscillators, comprising a plurality of devices of any of the preceding claims.

BRIEF DESCRIPTION OF THE DRAWINGS

The present invention will be better understood from reading the following description of non-limiting embodiments, with reference to the attached drawings, wherein below.

Figure 1:
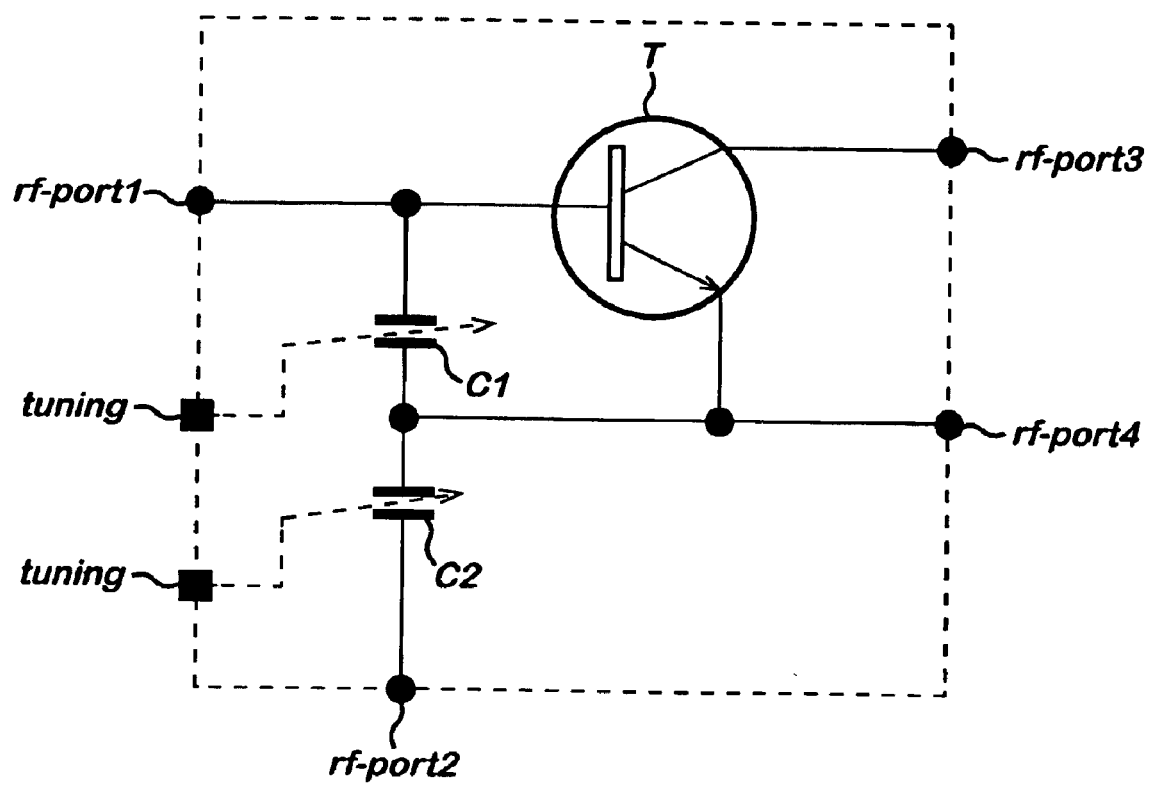
FIG. 1 is schematically depicting a MEMS-based tunable negative resistance device according to the invention.

It should be emphasized that the drawings of the instant application are not to scale but are merely schematic representations, and thus are not intended to portray the specific dimensions of the invention, which may be determined by skilled artisans through examination of the disclosure herein.

DETAILED DESCRIPTION

Regarding FIG. 1, an advantageous but exemplar embodiment of a MEMS-based tunable negative resistance device according to the invention incorporates the integration of an active component T and two passive components $C_1$ and $C_2$ into one IC-package or chip indicated in FIG. 1 by the dotted outer line and fabricated on the basis of the so called MEMS ("Micro-Electro-Mechanical-Systems") technology. According to the example the active component is realized as a bipolar NpN-transistor T and the two passive components as two tunable capacitors $C_1$ and $C_2$, i.e. so called varactors. As can be seen from FIG. 1 the exemplar inventive device further incorporates a rf-signal path provided with four signal ports rf-port1, rf-port2, rf-port3 and rf-port4 each of which at an outer IC-package surface for the interconnecting with a further component and in general individually usable as an input or an output for the signal path, respectively.

Each of the varactors $C_1$, and $C_2$ is controllable based on an actuator part for driving a movable or variable capacity element of the variable capacitor $C_1$ or $C_2$ causing a variation of the effective area thereof, for example by changing the degree of engagement of fingers of a comblike structure or by changing the distance between two plates, wherein the drive of the actuator part controlled by a tuning voltage is de-coupled from the signal path, as described below.

For the use of the depicted inventive device as an active part or negative resistor of a voltage controlled oscillator (VCO) the rf-port1 is connected via the signal-path to the Basis of the transistor T and to the varactor $C_1$, the rf-port2 to the second varactor $C_2$, the rf-port3 to the Collector, and the rf-port4 is interconnecting via the signal-path the emitter of the transistor T and the respective second terminal of both varactors $C_1$ and $C_2$.

As can be further seen from FIG. 1, for the completion of a VCO-circuit the necessary DC components and the parallel resonance circuit or tank-circuit have to be added.

Regarding the depicted device, for adding an external resonance circuit, advantageously, a L-C-parallel resonance circuit, a ceramic quarter wavelength resonator, a quarter wavelength stripline or a MEMS-based L-C-combination or fixed or variable inductor is used, in particular in dependent on application specific constraints and/or requirement.

Furthermore, each tunable capacitor $C_1$ or $C_2$ practically is connected to a separate tuning port "tuning" each of which can be controlled via an analogue voltage or via a digital to analogue converter.

Based thereon, the absolute amount of the capacity between rf-port1 and rf-port2 thus is determining together with an added parallel resonance circuit the operating frequency of the oscillator. Furthermore, the ratio between both capacitors $C_1$ and $C_2$ is determining the impedance for optimization, in particular for matching purposes between the tank-circuit and the negative resistor.

It is noted, that the number of two tunable capacitors $C_1$ and $C_2$ and one transistor T, as depicted in FIG. 1, is just an example. With the internal structure of that inventive device however, it is possible already to change the ratio of the used varactor capacitances $C_1$ and $C_2$ for optimization, to change the complete capacitance between rf-port1 and rf-port2 for tuning purposes. Furthermore due to the fact, that only a minimum of components is used a very high tuning range is ensured.

Even with regard to the manufacture, the inventive device may be incorporated into an rf-system to easily tune sensitive rf-parameters for optimization purposes, instead of individually designing and optimizing a plurality of matched circuits of the rf-system.

As mentioned above, the entire inventive IC-package or device may be produced by providing 3-dimensional mechanical structures for example based on a bulk micro-machining technology and/or a surface micromachining technology.

In particular, in bulk micromachining these structures, in particular the tunable capacitors $C_1$ and $C_2$ may be sculpted within the confines of a wafer by exploiting the anisotropic edging rates of different atomic crystallographic plans in the wafer. On the other hand side, the structures may be formed by the process of fusion bonding, which entails building up a structure by atomically bonding various wafers.

According to the surface micromachining based MEMS technology the 3-dimensional mechanical structures may be built up by the orchestrated addition and removal of a sequence of thin film layers to or from a wafer surface.

As a further alternative the mechanical structures may be fabricated by using thick photoresists that are exposed to X-rays to produce molds that are subsequently used to form high-aspect ratio electroplated 3-dimensional structures.

In this regard, e.g., based on a Micro-Electro-Mechanical-Systems-technology, very small and well defined parasitic components are obtainable within the MEMS-device ensuring a very low insertion loss, a high linearity and a high isolation, in particular with regard to the tuning or control signal transmitted to the actuators of the capacitors, that is essentially absolutely de-coupled or isolated from the switch contacts and hence, from the high-frequency or radio-frequency signal path. As a consequence, using such inventive MEMS-device at least as "key-cell" for a VCO is leading to a very enhanced re-configurable VCO, which can be optimized for the desired frequency band within a wide tuning range.

The actuators of the varactors, such as $C_1$ and $C_2$, may be based on a plurality of structures including a cantilever, a membrane, a shape-memory alloy and/or a multi-pole/multi-throw.

As an actuation mechanism an electrostatic mechanism is used, i.e. a positive and/or negative charge applied by a control or tuning voltage between certain structural members of the MEMS components illicit coulomb forces, which produce motion. As an alternative, the actuation mechanism may be based on a piezoelectric effect, i.e. the control voltage is applied on a certain structure of a respective MEMS component for inducing a field, which changes the physical dimensions of the structure to communicate motion. As further exemplar alternatives, a control current can be forced through a certain element of a respective MEMS component causing it to heat up and expand with the physical dimensional change used to communicate motion or a control signal can induce a magnetic force producing motion.

Hence, a number of actuation mechanisms may be used for high frequency MEMS device applications. However, an electrostatic based actuation is one of the most advantageous actuation mechanisms and surface micromachining, which is used for producing electrostatically based actuators, is compatible with integrated circuit fabrication processes.

Furthermore, the MEMS components can be used with resistive or metal-to-metal contact areas and/or with capacitively coupled switching areas in which a contact is made via an insulating dielectric layer.

As mentioned above, the effective areas of the variable capacitor $C_1$ and $C_2$ are practically based on at least two spaced plates or on a comblike structure, wherein the tuning of each of the capacitor $C_1$ and $C_2$ then can be based on a variation of the effective area of the capacitor by changing the distance between the plates or by changing the degree of engagement of fingers of the comblike structure, controlled by the respective tuning voltage.

Correspondingly, based on the advantageous embodiments using the MEMS technology, the varactor tuning voltage is isolated from the high frequency-signal path, since each MEMS-varactors $C_1$ or $C_2$ offers two connectors for the variable capacitance element and two connectors for the tuning voltage. Hence, in particular the tunable capacitor has a very low noise by using the MEMS technology.

Thus, by using the MEMS-technology, substantially all internal parasitics of the MEMS structures are well defined without no production spread in substantial, so that low tolerance components are achieved such that the complete configuration is universal in terms of reconfiguration and optimization and can be used in re-configurable and/or tunable systems and/or in several areas of a receive/transmit chain, in particular within applications where the re-configuration and/or tuning requirements are not critical with regard to time, since the mechanical structures or components may introduce a kind of mechanical inertia.

Furthermore, a plurality of such small inventive MEMS-devices may be combined to a kind of bank for enabling for instance to combine a set of VCO's to a "re-configurable VCO-bank", substantially without any PCB (Printed Circuit Board) constraints.

It is mentioned, that even the invention is described with regard to the appended figure, the invention also comprises embodiments incorporating a different number and/or different types of active and/or passive components, since the structure of the inventive device can also be scaled in terms of more fixed and variable devices. For example, the transistor T may be based on a FET or even on PnP-transistor. Even, the control or tuning paths to control the variable or tunable capacitors may be alternatively combined into one control bus.

What is claimed is:

1. A device for providing tunable high-frequency and/or radio-frequency comprising within one IC-package at least four signal paths providing at least two input and at least two output ports, at least one active component and at least one variable passive component connected at least with an input port of the active component, and at least one control path for controllably tuning the at least one variable passive component, further comprising at least two variable passive components, each of which is individually controllable by the at least one control path.

2. The device of claim 1, wherein the at least one control path is isolated from the signal path into which the at least one variable component is connected.

3. The device of claim 1, wherein each passive component comprises an actuator for driving a variable element of the component to vary an effective area thereof.

4. The device of claim 1, wherein a variable component respectively comprises an actuating mechanism based on an electrostatic, piezoelectric, thermal, magnetic or bi-metallic actuator functionality.

5. The device of claim 1, wherein variable component is a MEMS varactor ($C_1$, $C_2$).

6. The device of claim 1, wherein the active component is a transistor element.

7. The device of claim 1, wherein the at least one passive component is a variable capacitor.

8. The device of claim 3, wherein the varying of an effective area thereof is by changing the degree of engagement of fingers of a comblike structure or by changing the distance between at least two plates.

9. A device for providing tunable high-frequency and/or radio-frequency comprising within one IC-package at least four signal paths providing at least two input and at least two output ports, at least one active component and at least one variable passive component connected at least with an input port of the active component, and at lest one control path for controllable tuning the at least one variable passive component, wherein the at least one control path is isolated from the signal path into which the at least one variable component is connected.

* * * * *